United States Patent [19]
Yamazaki et al.

[11] Patent Number: 5,515,323
[45] Date of Patent: May 7, 1996

[54] NON-VOLATILE MEMORY CIRCUIT FOR LENGTHENING SERVICE LIFE OF NON-VOLATILE MEMORY DEVICES

[75] Inventors: Akihiro Yamazaki, Sagamihara; Toru Okawa, Yokohama both of Japan

[73] Assignee: Kabushiki Kaisha Toshiba, Kawasaki, Japan

[21] Appl. No.: 376,831

[22] Filed: Jan. 23, 1995

[30] Foreign Application Priority Data

Jan. 27, 1994 [JP] Japan .................................. 6-007579

[51] Int. Cl.$^6$ ............................................ G11C 7/00
[52] U.S. Cl. ................. 365/155.21; 365/189.05; 365/194; 365/233.5
[58] Field of Search .............................. 365/49, 185, 194, 365/210, 233.5, 189.05

[56] References Cited

U.S. PATENT DOCUMENTS

| | | | |
|---|---|---|---|
| 5,035,284 | 4/1994 | Iwase | 365/238.5 |
| 5,313,434 | 5/1994 | Abe | 365/233.5 |
| 5,313,435 | 5/1994 | Kim et al. | 365/233.5 |
| 5,343,432 | 8/1994 | Matsno et al. | 365/203 |
| 5,404,334 | 4/1995 | Pascucci et al. | 365/210 |

*Primary Examiner*—David C. Nelms
*Assistant Examiner*—Son Dinh
*Attorney, Agent, or Firm*—Finnegan, Henderson, Farabow, Garrett & Dunner

[57] ABSTRACT

A memory cell array is constructed by electrically programmable non-volatile memory cells. A memory peripheral circuit creates an address signal for designating an address in the memory cell array by means of the row decoder and the column decoder to effect the access operation for the memory cell array. An ATD circuit for generating a control signal which permits selection of the memory cell involved in the access operation in the memory cell array for a preset period of time in response to a variation of the address signal is provided. A latch circuit for latching readout data from the memory cell in an active period of the control signal is provided. That is, all of the memory cells in the memory cell array are set in the non-selected state in a period other than the active period of the control signal.

12 Claims, 4 Drawing Sheets

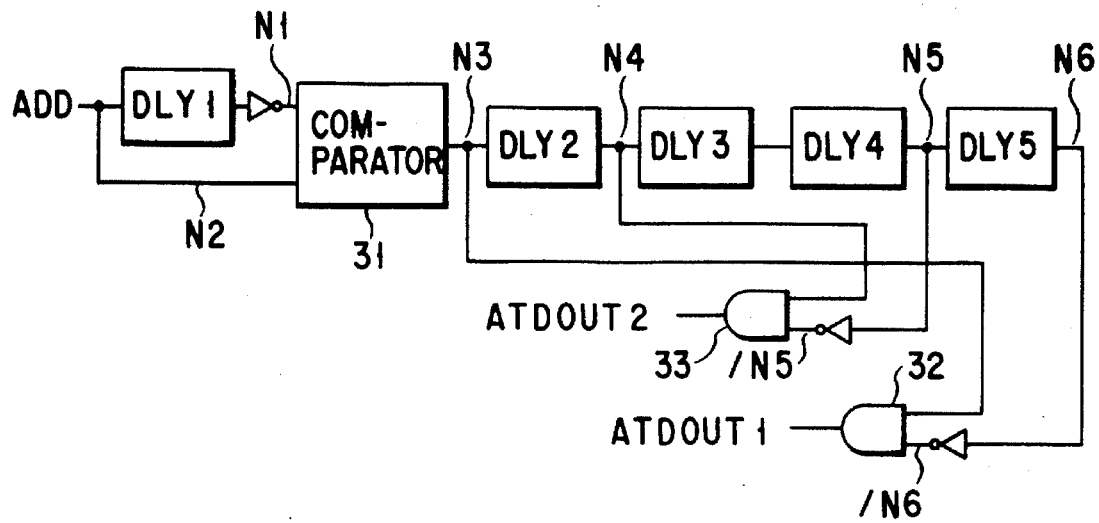
F I G. 7
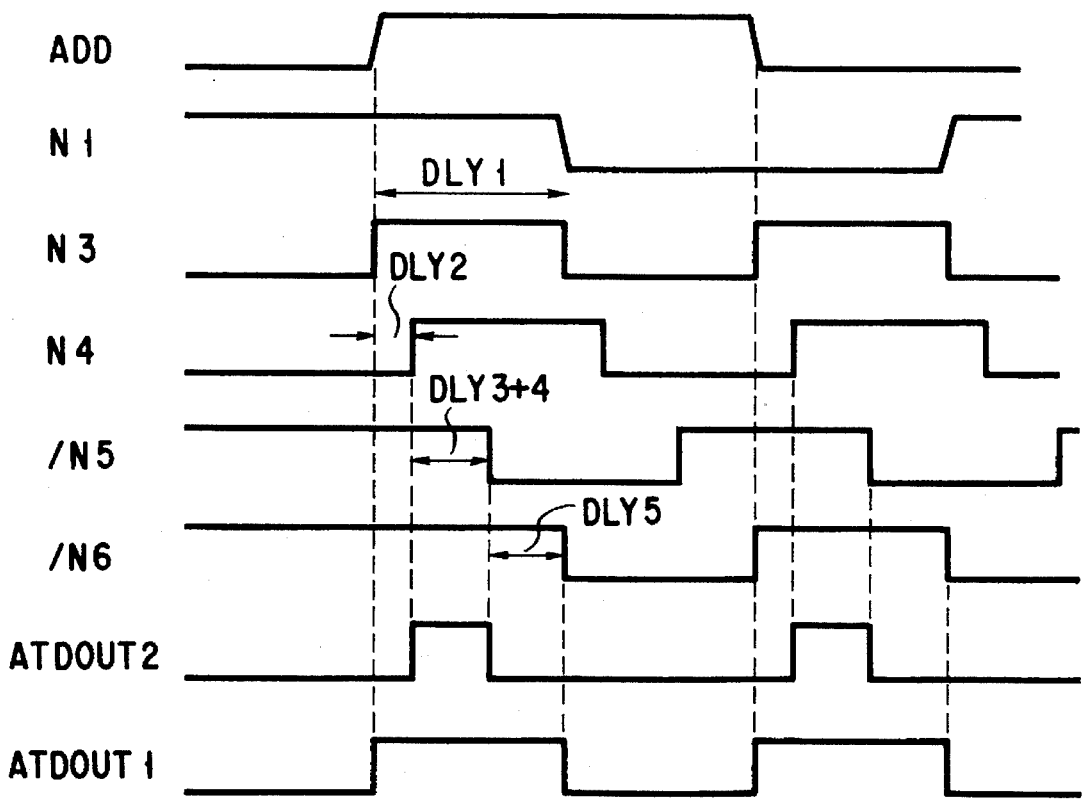
F I G. 8

NON-VOLATILE MEMORY CIRCUIT FOR LENGTHENING SERVICE LIFE OF NON-VOLATILE MEMORY DEVICES

BACKGROUND OF THE INVENTION

1. Field of the Invention

This invention relates to a non-volatile memory device, and more particularly to a readout system circuit of a non-volatile memory device.

2. Description of the Related Art

A flash type EEPROM (Electrically Erasable Programmable Read Only Memory) is one type of electrically erasable and programmable non-volatile memory. Each memory cell of such a non-volatile memory can be constructed by one transistor unlike a two-transistor type byte type non-volatile semiconductor memory. Therefore, the memory cell size can be reduced and it is expected to use this type of memory instead of a magnetic disk of large capacity.

The construction of a memory cell constructed by a floating gate MOS transistor in the flash type EEPROM and general data programming and erasing means are explained with reference to FIGS. 1 and 2.

FIG. 1 is a plan view of a memory cell portion of the floating gate MOS transistor and FIG. 2 is a cross sectional view taken along the line 2—2 of FIG. 1. The floating gate MOS transistor has a stacked gate electrode 56 which is constructed by a gate oxide film 52 formed on a semiconductor substrate 51, a floating gate 53 of polysilicon formed on the gate oxide film, a gate oxide film 54 formed on the floating gate, and a control gate 55 of polysilicon formed on the gate oxide film. A source region 57 and a drain region 58 are formed in the surface area of the substrate 51 by implanting ions into the substrate surface with the gate electrode 56 used as a mask.

Generally, the data programming operation is effected by applying a voltage of 6 to 7 V to the drain region and applying a high voltage of approx. 12 V to the control gate 55. In this operation, the floating gate 53 is set to a high potential because of the capacitive coupling, thereby causing hot electrons generated by the avalanche breakdown in a portion near the drain region to be injected into the floating gate 53 via the gate oxide film 52. As a result, the threshold voltage of the memory cell is enhanced and the programming operation is completed.

Further, in the erasing operation, the control gate 55 is set to the ground potential, the drain region 58 is set in the electrically open state, and a high voltage is applied to the source region 57 to discharge electrons injected into the floating gate 53 by a method called the Fowler-Nordheim tunneling so as to lower the threshold voltage of the memory cell. In order to achieve the above programming and erasing operations, the oxide film 52 lying under the floating gate 53 is formed of a thin oxide film called a tunnel oxide film.

FIG. 3 is a circuit diagram showing the construction of a readout system circuit in the conventional flash type EEPROM. A memory cell MC is one of non-volatile transistors constituting a memory cell array 11, the control gate thereof is connected to a word line WL which is supplied with a row address signal via a row decoder 12, the source thereof is connected to GND (ground potential), and the drain thereof is connected to a bit line BL. The bit line BL is connected to a sense amplifier 15 via a column gate 14 which receives a column address signal from a column decoder 13 at the gate thereof.

The bit line BL is connected to a pre-amplifier circuit PR1 in the sense amplifier 15. For example, the pre-amplifier PR1 is constructed by a transistor which receives an intermediate bias voltage Vbias at the gate thereof and supplies a low voltage of approx. 1 V to the bit line BL. An output line 16 connected to the bit line BL via the pre-amplifier PR1 is connected to the inverting input terminal of a differential amplifier AMP via a load TR1. The load TR1 is a P-channel transistor whose gate and drain are connected to the output line and whose source is connected to a high potential side power source, for example.

The non-inverting input terminal of the differential amplifier AMP is connected to a dummy cell side output line used as a reference. The control gate, source and drain of a dummy cell DMC are respectively connected to a power supply potential VC, GND and a dummy bit line DBL. The dummy bit line DBL is connected to a pre-amplifier circuit PR2 having the same construction as the above pre-amplifier circuit via a transistor having the same construction as the above column selection transistor. An output line connected to the bit line DBL via the pre-amplifier PR2 is connected to the non-inverting input terminal of the differential amplifier AMP via a load TR2. The weight of the load TR2 is set twice that of the load TR1, for example.

The readout operation of the circuit with the above construction is as follows. In order to determine whether a memory cell MC selected by signals generated from the row decoder and column decoder in response to an input address signal, a variation in the potential of the bit line BL is detected by the differential amplifier AMP. That is, programming data of "0" from the exterior is stored as the OFF state by storing electrons into the floating gate. This is called an "OFF" cell. In the case of "1" data, electrons are not stored and data is stored as the ON state. This is called an "ON" cell.

The dummy cell DMC on the reference side is set in the normally-ON state and an input voltage Vref from the dummy cell side in the differential amplifier AMP is determined based on the relation between the current Idcel of the dummy cell and the load TR2. The voltage Vref is a preset intermediate potential and is set to a potential between an input potential to the inverting input terminal set when the selected memory cell is an ON cell and an input potential to the inverting input terminal set when the selected memory cell is an OFF cell.

That is, as shown in FIG. 4, the input potential Vsa of the differential amplifier AMP from the cell side is set to a potential Vsa lower than the intermediate potential vref by the weighting of the loads when the memory cell MC is set in the ON state. Therefore, the output OUT of the sense amplifier S/A is set to the "H" level and the selected memory cell is determined to be an ON cell. Further, since no DC path to GND is provided when the selected memory cell MC is set in the OFF state, the potential Vsa is pulled up to a level higher than the intermediate potential vref. Therefore, the detection output of the sense amplifier is set to the "L" level and the selected memory cell is determined to be an OFF cell.

With the above construction, a certain potential is applied to a bit line connected to a selected column decoder irrespective of ON/OFF of the cell. The potential is controlled to approx. 1 V irrespective of ON/OFF of the cell in the actual circuit by taking the reliability of the cell into consideration.

However, since the memory cell size tends to be reduced in order to attain a larger memory capacity, the channel length thereof is reduced, hot electrons tend to be generated and the reliability for the drain voltage is made severe. Further, the tunnel oxide film formed under the floating gate for erasing permits a tunnel current to easily flow when the gate electric field is applied and the reliability for the gate voltage is severe.

A voltage of 5 V is applied to a cell connected to a selected row decoder. The drain voltage is 1 V and the gate voltage is 5 v at the readout time. The voltage stresses will not cause any problem in a short period of time. However, in order to provide the warranty for 10 to 20 years, they may be an important problem from the viewpoint of further improvement of the reliability.

At present, the reliability required for the memory cell subject to the above stresses are satisfied from the viewpoint of process and structure, and they are mass-produced. However, in order to further enhance the reliability, it is important to pay more attention to the circuit design.

The point to be noted is that the stress is always applied to any one of the cells irrespective of the readout at the time of CE (chip enable) in the prior art. Further, the voltage stress is applied to a specified cell in many cases in the standby mode of the chip. Therefore, it is necessary to design the circuit structure so as to solve the above problem.

SUMMARY OF THE INVENTION

This invention has been made in order to solve the above problem and an object of this invention is to provide a non-volatile memory circuit for improving the read/retention characteristic (data holding characteristic) of a non-volatile memory such as a flash type EEPROM by reducing the stress applied at the readout time by making an adequate circuit design.

The above object can be attained by the following construction.

A non-volatile memory circuit comprises a memory cell array having electrically programmable non-volatile memory cells; a memory peripheral circuit having a row decoder and a column decoder, for creating an address signal for designating an address in the memory cell array by means of the row decoder and the column decoder according to an external signal to effect the access operation with respect to the memory cell array; control signal generation means for generating a control signal which permits selection of the memory cell involved in the access operation in the memory cell array for a preset period of time in response to a variation of the address signal; and a latch circuit for latching data read out from the memory cell in an active period of the control signal; wherein all of the memory cells in the memory cell array are set in the non-selected state in a period other than the active period of the control signal.

With the above construction, the period of selection of the memory cell (the period of application of stress to the gate insulation film of the cell at the readout time) is limited to a period from the address variation to the latching of the readout data by the latch circuit for detecting the address variation and latching readout data, and all of the memory cells are set into the non-selected state in the other period. Thus, the voltage stress can be prevented from being applied to the memory cell in a period other than the minimum necessary period of time at the readout time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram showing part of the circuit of FIG. 5 as an example of a circuit of a main portion of this invention;

FIG. 8 is a waveform diagram indicating waveforms of signals at various portions of the circuit of FIG. 7, for illustrating the operation of the circuit.

DETAILED DESCRIPTION OF THE PREFERRED EMBODIMENTS

Figure 5:
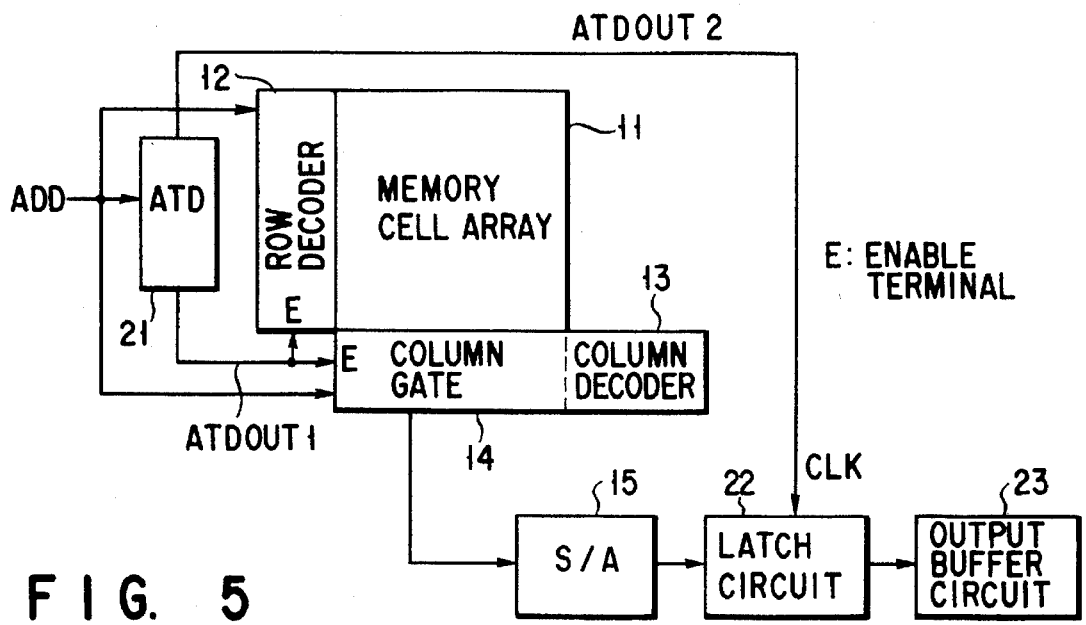
FIG. 5 is a circuit diagram of a readout system of a non-volatile memory circuit according to an embodiment of this invention.
Figure 6:
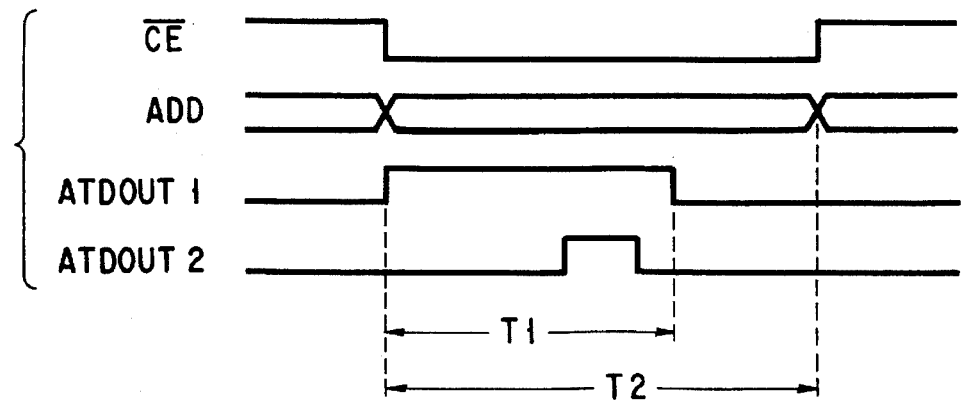
FIG. 6 is a timing chart for illustrating the operation of the circuit shown in FIG. 5.

FIG. 5 is a circuit diagram of a readout system of a non-volatile memory circuit according to an embodiment of this invention. FIG. 6 is a timing chart for illustrating the operation of the circuit shown in FIG. 5. In this example, a signal which changes according to a variation of the address is not input to the circuit from the exterior, and instead of this, an ATD (address transition detector) is provided in the circuit.

When the chip enable state is set and a variation of the address signal ADD is detected by an ATD 21, a detection signal ATDOUT1 having a preset pulse width is output. Only in this period of time, the row decoder and the column decoder are set in the enable state and a memory cell corresponding to the input address is selected.

Figures 1, 2:
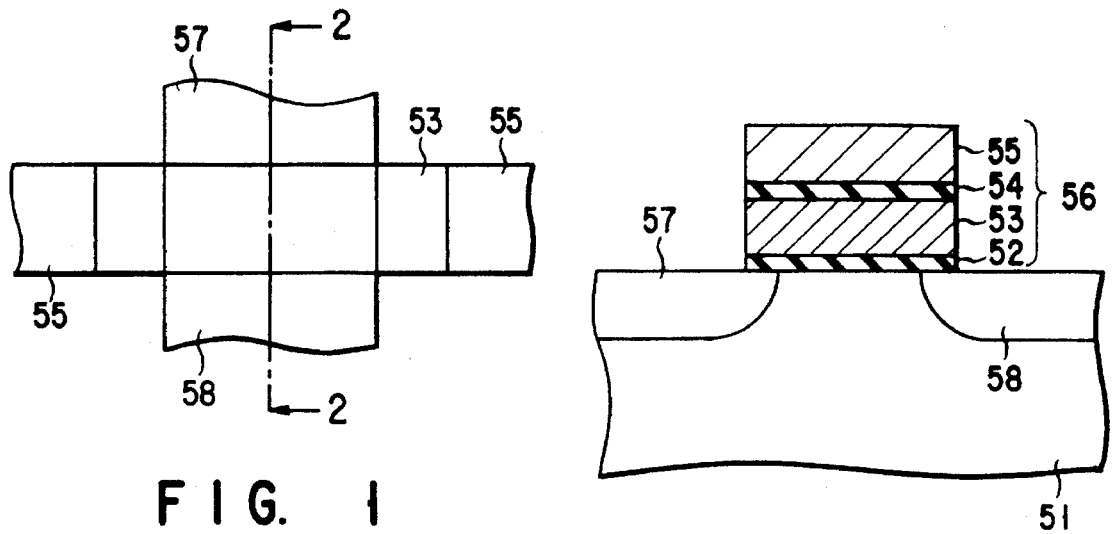
FIG. 1 is a plan view of a memory cell portion of a floating gate type MOS transistor.
FIG. 2 is a cross sectional view taken along the 2—2 line of FIG. 1.
Figure 3:
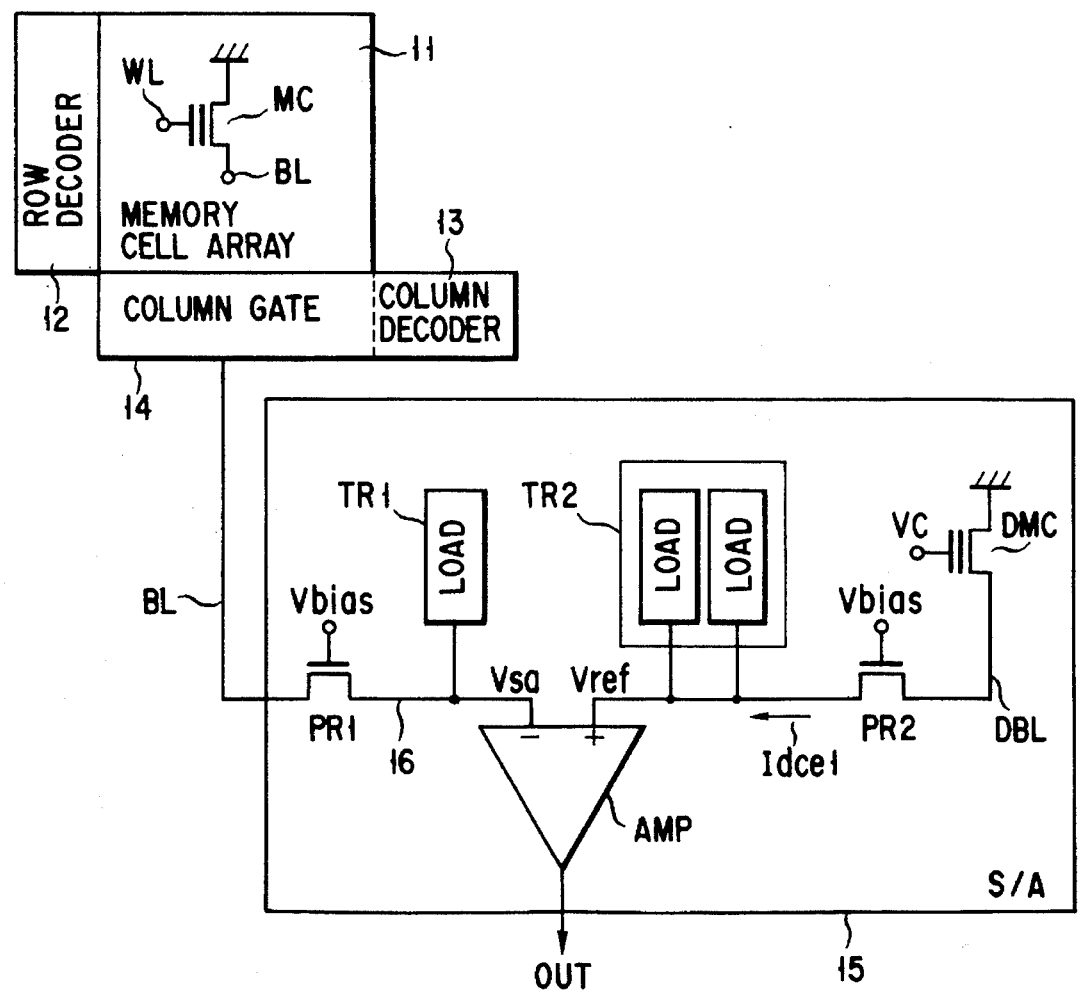
FIG. 3 is a circuit diagram showing the construction of a readout system circuit in the conventional flash type EEPROM.
Figure 4:
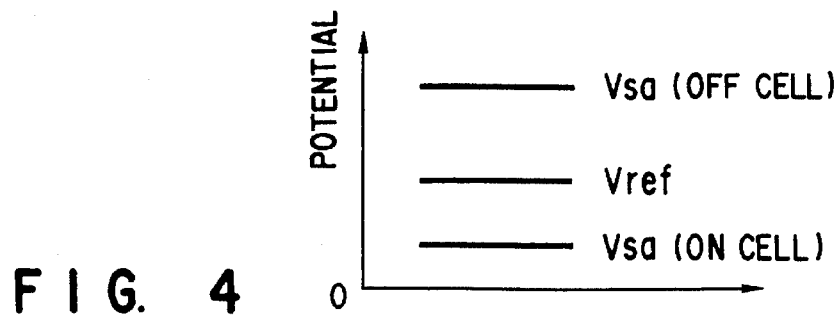
FIG. 4 is a diagram showing the relation between the voltage levels of input voltages to a differential amplifier shown in FIG. 3.

At the same time, a dummy cell DMC on the reference side of a sense amplifier 15 is also selected (refer to FIG. 3). Corresponding potentials are applied to the inverting input terminal and non-inverting input terminal of a differential amplifier AMP and the readout result is output from the differential amplifier. Further, the readout result is latched by a signal ATDOUT2 from the ATD 21. The signal ATDOUT2 rises at later timing and falls at earlier timing than the signal ATDOUT1.

That is, readout data is latched by a latch circuit 22 with the timing of fall of the signal ATDOUT2 used as a clock (CLK). After this, the signal ATDOUT1 is set to the "L" level, the row decoder and column decoder are set into the disable state, all of the memory cells and dummy cells are set into the non-selected state, and the stress to the drain/gate of the memory cell is released. Readout data of the latch circuit 22 is read out via an output buffer circuit 23.

FIG. 7 shows an example of the circuit construction of the ATD 21 which is a main portion of this invention and is used to form the signals ATDOUT1, ATDOUT2 and FIG. 8 is a waveform diagram indicating waveforms of signals at various portions of the circuit of FIG. 7, for illustrating the operation of the circuit. When an address signal ADD is changed, a signal having a width corresponding to the delay time of a delay circuit DLY1 appears on the output node N3 of a comparator 31. The node N3 is connected to a series circuit of delay circuits DLY2, DLY3, DLY4 and DLY5. An output of an AND gate 32 having two input terminals for receiving an output (node N3) of the comparator 31 and an inverted signal output (/N6) from the output terminal of the delay circuit DLY5 is used as the signal ATDOUT1 and an output of an AND gate 33 having two input terminals for receiving an output (node N4) of the delay circuit DLY2 and an inverted signal output (/N5) from the output terminal of the delay circuit DLY4 is used as the signal ATDOUT2.

Therefore, the signal ATDOUT1 is obtained in the form of a signal having a width corresponding to the delay times of the delay circuits DLY2, DLY3, DLY4 and DLY5 and the signal ATDOUT2 is obtained in the form of a signal whose rising timing is delayed with respect to the signal ATDOUT1 by the delay time of the delay circuit DLY2 and whose falling timing is set to lead that of the ATDOUT1 by the delay time of the delay circuit DLY5.

According to the above embodiment, as shown in the timing chart of FIG. 6, for example, the stress application time T1 for the memory cell at the readout time can be reduced to approx. ⅔ of the stress application time T2 in the conventional case. Therefore, the read/retention characteristic is improved by substantially 1.5 times that of the conventional case. This effect becomes more significant when the memory is used in a system in which the access time of the memory is shorter and the readout cycle of the CPU is longer. Further, in a system such as a burst ROM in which a large number of memory cells are simultaneously accessed, a more significant effect can be attained. That is, since the readout cycle is effected several times for each access to the memory (application of the voltage stress), the stress application time for one readout operation becomes shorter.

Further, in a memory having an increased memory capacity, the influence on the chip size by addition of the ATD can be neglected. That is, according to this invention, the read/retention characteristic can be markedly improved simply by adding a small amount of circuit.

Figure 9:
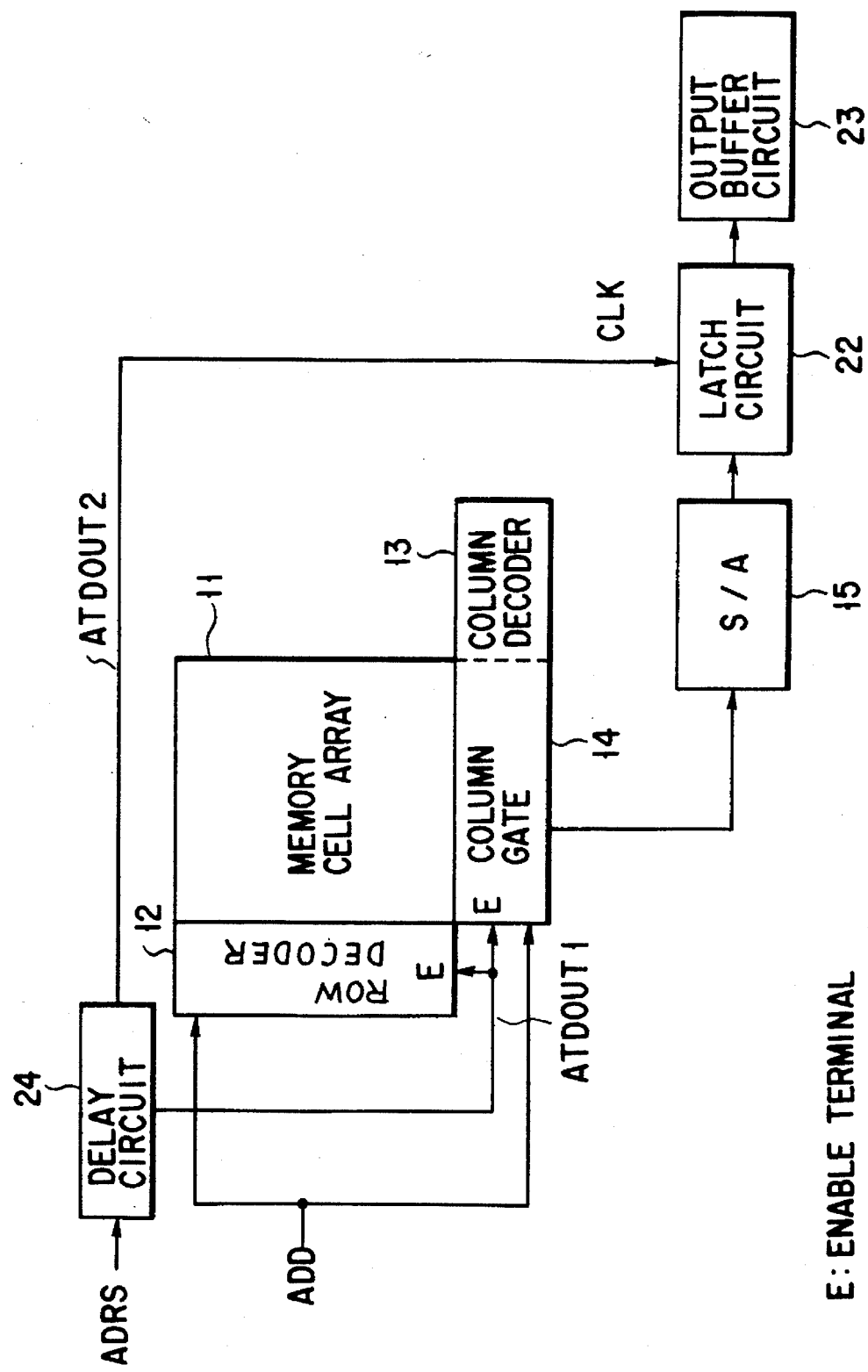
FIG. 9 is a circuit diagram of a readout system of a non-volatile memory circuit according to another embodiment of this invention.

The above embodiment is not limited to the flash type EEPROM and can be applied to a non-volatile memory circuit such as an EPROM. Further, in the above embodiment, the ATD is used, but the ATD can be omitted in a case where an external address detection signal such as an address latch strobe signal (ADRS) is supplied. That is, as shown in the construction of another embodiment of FIG. 9, signals corresponding to the signals ATDOUT1, ATDOUT2 as described above may be formed by use of a delay circuit 24 based on the signal ADRS.

As described above, according to this invention, a non-volatile memory circuit can be provided in which since the period of selection of a memory cell (the stress application period at the readout time) is limited to a period from the address variation time to the latching of the readout data by the latch means for detecting the address variation and latching readout data so as not to apply the stress in a period other than the minimum necessary period, the read/retention characteristic (data holding characteristic) of a non-volatile memory can be significantly improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A non-volatile memory circuit comprising:

a memory cell array having electrically programmable non-volatile memory cells;

a memory peripheral circuit, having a row decoder and a column decoder, for creating an address signal for designating an address in said memory cell array by means of said row decoder and said column decoder according to an external signal to effect the access operation with respect to said memory cell array;

control signal generation means for generating a first control signal which permits selection of the memory cell involved in the access operation in said memory cell array for a preset period of time in response to a variation of the address signal, and for generating a second control signal having a rise time which lags behind a rise time of the first control signal and a fall time which leads a fall time of the first control signal; and a latch circuit for latching data read out from the memory cell in an active period of the second control signal;

wherein all of the memory cells in said memory cell array are set in a non-selected state in a period other than an active period of the first control signal.

2. A non-volatile memory circuit according to claim 1, wherein said row decoder and said column decoder are set in a disable state in a period other than the active period of the first control signal to set all of the memory cells in the non-selected state.

3. A non-volatile memory circuit according to claim 1, wherein said control signal generation means includes an address transition detector for detecting a variation of the address signal.

4. A non-volatile memory circuit according to claim 3, wherein said address transition detector includes a delay circuit.

5. A non-volatile memory circuit according to claim 1, wherein said control signal generation means generates the first and second control signals in response to an externally supplied input signal different from the address signal.

6. A non-volatile memory circuit comprising:

a memory cell array having electrically programmable non-volatile memory cells;

a memory peripheral circuit having a row decoder and a column decoder, for creating an address signal for designating an address in said memory cell array by means of said row decoder and said column decoder according to an external signal to effect the access operation with respect to said memory cell array;

control signal generation means for generating a first control signal which permits selection of the memory cell involved in the access operation in said memory cell array for a preset period of time in response to a variation of the address signal and a second control signal whose active period is limited within an active period of the first control signal; and a latch circuit for latching data read out from the memory cell in the active period of the second control signal;

wherein all of the memory cells in said memory cell array are set in a non-selected state in a period other than the active period of the first control signal.

7. A non-volatile memory circuit according to claim 6, wherein said row decoder and said column decoder are set in a disable state in a period other than the active period of the first control signal to set all of the memory cells in the non-selected state.

8. A non-volatile memory circuit according to claim 6, wherein said control signal generation means includes a delay circuit.

9. A non-volatile memory circuit according to claim 6, wherein the second control signal has a rise time which lags behind a rise time of the first control signal and a fall time which leads a fall time of the first control signal.

10. A non-volatile memory circuit according to claim 6, wherein said control signal generation means includes an address transition detector for detecting a variation of the address signal.

11. A non-volatile memory circuit according to claim 10, wherein said address transition detector includes a delay circuit.

12. A non-volatile memory circuit according to claim 6, Wherein said control signal generation means generates the first and second control signals in response to an externally supplied input signal which is different from the address signal and is used to detect the address variation.

* * * * *

UNITED STATES PATENT AND TRADEMARK OFFICE
CERTIFICATE OF CORRECTION

PATENT NO. : 5,515,323
DATED : May 07, 1996
INVENTOR(S) : Akihiro YAMAZAKI et al.

It is certified that error appears in the above-indentified patent and that said Letters Patent is hereby corrected as shown below:

Claim 12, column 8, line 13, "Wherein" should read --wherein--.

Signed and Sealed this

Fourteenth Day of January, 1997

Attest:

BRUCE LEHMAN

*Attesting Officer*    *Commissioner of Patents and Trademarks*